US010262782B1

United States Patent
Yen et al.

(10) Patent No.: US 10,262,782 B1
(45) Date of Patent: Apr. 16, 2019

(54) INTEGRATED INDUCTOR STRUCTURE

(71) Applicant: REALTEK SEMICONDUCTOR CORPORATION, Hsinchu (TW)

(72) Inventors: Hsiao-Tsung Yen, Hsinchu (TW); Cheng-Wei Luo, Hsinchu (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/211,470

(22) Filed: Dec. 6, 2018

Related U.S. Application Data

(62) Division of application No. 15/368,298, filed on Dec. 2, 2016.

(30) Foreign Application Priority Data

Jan. 7, 2016 (TW) .............................. 105100356 A

(51) Int. Cl.
*H01F 5/00* (2006.01)
*H01F 17/00* (2006.01)
(Continued)

(52) U.S. Cl.
CPC ......... *H01F 17/0006* (2013.01); *H01F 17/02* (2013.01); *H01F 27/29* (2013.01);
(Continued)

(58) Field of Classification Search
CPC .............................................. H01F 2017/0046
(Continued)

(56) References Cited

U.S. PATENT DOCUMENTS 7,642,891 B2  1/2010 Einzinger et al.
8,183,971 B2  5/2012 Le Guillou et al.
(Continued)

FOREIGN PATENT DOCUMENTS

CN  104218901 A  12/2014
CN  105023914 A  11/2015

OTHER PUBLICATIONS

The State Intellectual Property Office(SIPO), "Office Action", dated Sep. 5, 2018. Summary of the OA letter: Reference 1 anticipates claim 8. References 1 and 2 render claims 1, 2, 4, and 5 obvious.
(Continued)

*Primary Examiner* — Ronald Hinson
(74) *Attorney, Agent, or Firm* — WPAT, PC

(57) ABSTRACT

An 8-shaped integrated inductor includes a first terminal; a second terminal; a third terminal; a bridging structure that includes a first metal segment and a second metal segment, the first metal segment and the second metal segment being disposed in different layers of a semiconductor structure and partially overlapping; a first sensing unit employing the first terminal and the third terminal as its two terminals and including the first metal segment; and a second sensing unit employing the second terminal and the third terminal as its two terminals and including the second metal segment and a third metal segment. The third metal segment is disposed at a metal layer different from the second metal segment and conductively connecting other metal segments of the second sensing unit without crossing the metal segments of the first sensing unit.

9 Claims, 8 Drawing Sheets

(51) Int. Cl.
*H01L 49/02* (2006.01)
*H01L 23/522* (2006.01)
*H01F 27/29* (2006.01)
*H01F 17/02* (2006.01)

(52) U.S. Cl.
CPC .......... *H01L 23/5227* (2013.01); *H01L 28/10* (2013.01); *H01F 2017/0046* (2013.01); *H01F 2017/0073* (2013.01); *H01F 2017/0086* (2013.01)

(58) Field of Classification Search
USPC ........................................................ 336/200
See application file for complete search history.

(56) References Cited

U.S. PATENT DOCUMENTS

| | | |
|---|---|---|
| 9,299,764 B2 | 3/2016 | Mattsson et al. |
| 2002/0130387 A1* | 9/2002 | Carpentier ............. H01L 27/08 257/531 |
| 2003/0210122 A1* | 11/2003 | Concord ................. H01F 5/003 336/200 |
| 2008/0130257 A1* | 6/2008 | Li Puma ............. H01F 17/0006 361/782 |
| 2009/0261452 A1* | 10/2009 | Tsujimoto ........... H01F 17/0006 257/531 |
| 2012/0044034 A1 | 2/2012 | Nazarian et al. |
| 2013/0135076 A1* | 5/2013 | Nagase ................... H01F 5/003 336/220 |
| 2013/0249660 A1* | 9/2013 | Ler ..................... H01F 17/0013 336/200 |
| 2014/0197916 A1* | 7/2014 | El-Tanani ............. H01L 23/522 336/200 |
| 2014/0357206 A1 | 12/2014 | Tsai |
| 2015/0303888 A1 | 10/2015 | Yen et al. |

OTHER PUBLICATIONS

U.S. Appl. No. 14/722,167.
U.S. Appl. No. 15/269,756.

* cited by examiner

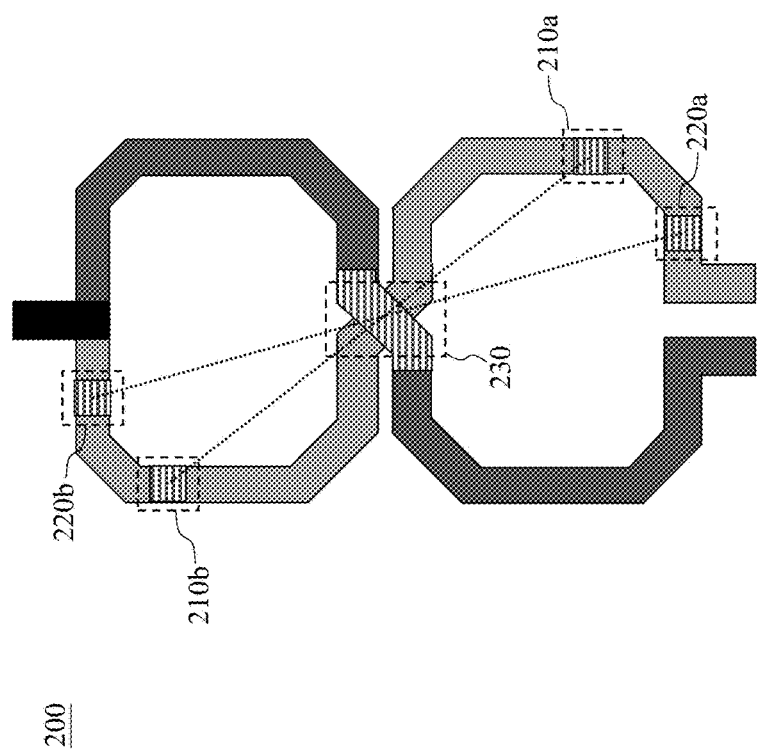

INTEGRATED INDUCTOR STRUCTURE

BACKGROUND OF THE INVENTION

1. Field of the Invention

The present invention relates to an integrated inductor, especially to a symmetric integrated inductor.

2. Description of Related Art

Inductors are important elements in radio frequency integrated circuits to implement impedance matching. As System-on-chips (SoC) become the mainstream of integrated circuits, integrated inductors gradually substitute conventional discrete elements and are commonly applied to radio frequency integrated circuits. However, the resistance values of different layers in a semiconductor structure are usually different from each other, resulting the mismatch in two inducing units of an integrated inductor as the integrated inductor usually uses a different layer to implement a bridging structure. The greater the resistance value is, the greater the inductance value becomes. Therefore, it becomes an important issue to fabricate an integrated inductor that has matched inductance values and resistance values.

SUMMARY OF THE INVENTION

In view of the issues of the prior art, an object of the present invention is to provide an integrated inductor structure to improve the symmetry of the sensing units of an integrated inductor, so as to make an improvement to the prior art.

An 8-shaped integrated inductor is disclosed. The 8-shaped integrated inductor includes a first terminal, a second terminal, a third terminal, a bridging structure, a first sensing unit, and a second sensing unit. The bridging structure includes a first metal segment and a second metal segment. The first metal segment and the second metal segment are located in different metal layers of a semiconductor structure and partially overlapping. The first sensing unit employs the first terminal and the third terminal as its two terminals and includes the first metal segment. The second sensing unit employs the second terminal and the third terminal as its two terminals and includes the second metal segment and a third metal segment. The third metal segment is located at a different metal layer from the second metal segment, and conductively connects other metal segments of the second sensing unit without crossing metal segments of the first sensing unit.

An 8-shaped integrated inductor, formed by a first sensing unit and a second sensing unit, is also disclosed. The 8-shaped integrated inductor includes a first terminal, a second terminal, a third terminal, a first coil, a second coil, and a bridging structure. The first terminal is a terminal of the first sensing unit. The second terminal is a terminal of the second sensing unit. The third terminal is a common terminal of the first sensing unit and the second sensing unit. A part of metal segments of the first coil is a part of the first sensing unit, and another part of metal segments of the first coil is a part of the second sensing unit. A part of metal segments of the second coil is a part of the first sensing unit, and another part of metal segments of the second coil is a part of the second sensing unit. The bridging structure connects the first coil and the second coil and includes a first metal segment located in a first metal layer. The second metal segment is located in a second metal layer and partially overlaps the first metal segment. The first metal layer and the second metal layer are different from the metal layers where the first coil and the second coil exist.

An integrated inductor, formed by a first sensing unit and a second sensing unit, is also disclosed. The integrated inductor includes a first terminal, a second terminal, a third terminal, an outer coil, an inner coil, and a bridging structure. The first terminal is employed as a terminal of the first sensing unit. The second terminal is employed as a terminal of the second sensing unit. The third terminal is employed as a common terminal of the first sensing unit and the second sensing unit. A part of metal segments of the outer coil is a part of the first sensing unit, and another part of metal segments of the outer coil is a part of the second sensing unit. The inner coil is located in a region enclosed by the outer coil. A part of metal segments of the inner coil is a part of the first sensing unit, and another part of metal segments of the inner coil is a part of the second sensing unit. The bridging structure connects the outer coil and the inner coil, and includes a first metal segment and a second metal segment. The first metal segment and the second metal segment are located in different metal layers of a semiconductor structure and partially overlapping. The first sensing unit includes the first metal segment. The second sensing unit includes the second metal segment and a third metal segment. The third metal segment is located in a different metal layer from the second metal segment. The third metal segment is conductively connected with other metal segments of the second sensing unit without crossing metal segments of the first sensing unit.

The integrated inductor structure of this invention achieves the purpose of adjusting the resistance value by adding metal segments on the integrated inductor. As such, the sensing units of the integrated inductor have matched resistance values and similar or even identical inductance values. As opposed to the conventional technology, this invention uses simple structures to improve the symmetry of the sensing units of the integrated inductor, such that the integrated inductor has better circuit performance.

These and other objectives of the present invention no doubt become obvious to those of ordinary skill in the art after reading the following detailed description of the preferred embodiments with reference to the various figures and drawings.

BRIEF DESCRIPTION OF THE DRAWINGS

FIG. 2 illustrates a structure of an 8-shaped integrated inductor according to another embodiment of this invention.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 1A:
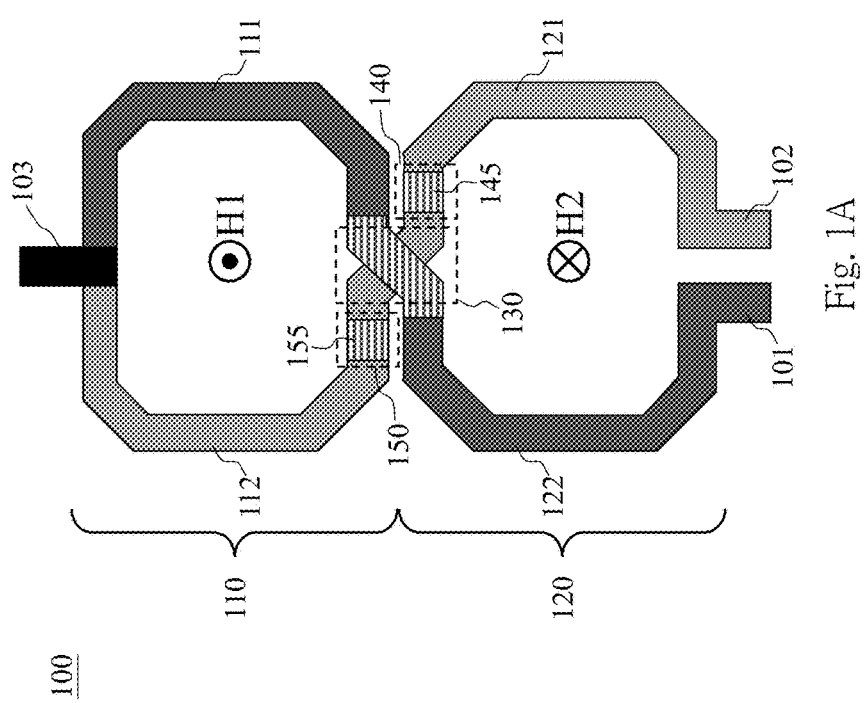
FIG. 1A illustrates a structure of an 8-shaped integrated inductor according to an embodiment of this invention.

FIG. 1A illustrates a structure of an 8-shaped integrated inductor according to an embodiment of this invention. The 8-shaped integrated inductor 100 includes two sensing units. The first sensing unit (in dark grey) uses the terminal 101 and the terminal 103 (i.e., the center tap of the 8-shaped integrated inductor 100) as its two terminals, and includes a metal segment 122 and a metal segment 111. The second sensing unit (in light grey) uses the terminal 102 and the terminal 103 as its two terminals, and includes a metal segment 121 and a metal segment 112. One advantage of the 8-shaped integrated inductor 100 is that, the magnetic field directions of the coil 110 (formed by the metal segments 111 and 112) and the coil 120 (formed by the metal segments 121 and 122), which are respectively denoted as H1 and H2 in the figure, are opposite. The opposite magnetic field directions are beneficial to suppressing magnetic field radiations to protect other electronic components from interferences. The metal segment 111, 112, 121 and 122 are located in the same metal layer. The coil 110 and the coil 120 are connected via a crossing bridging structure 130.

Figure 1B:
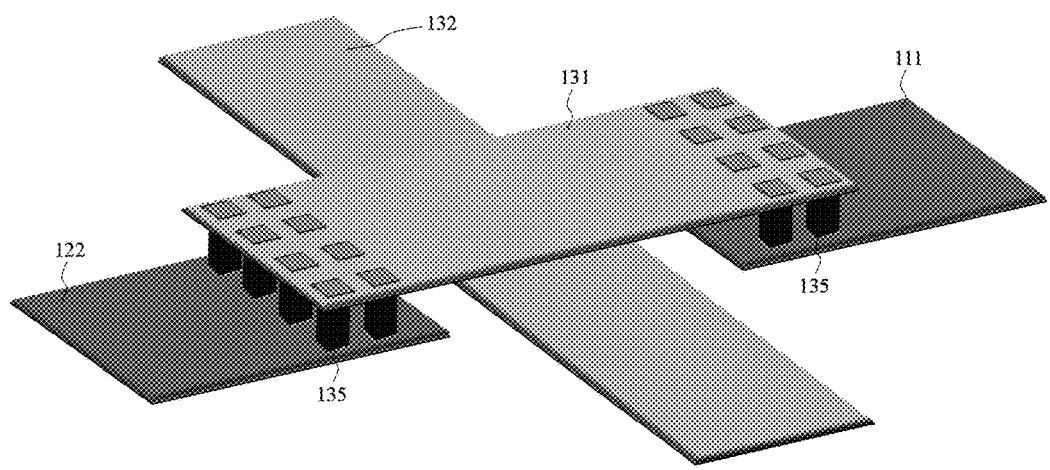
FIG. 1B illustrates an enlarged figure of the bridging structure 130.

FIG. 1B illustrates an enlarged figure of the bridging structure 130. The bridging structure 130 is substantially formed by a metal segment 131 and a metal segment 132 that are located in different layers of the semiconductor structure; for example, one is located in an Ultra Thick Metal (UTM) layer, while the other is located in a Re-Distribution Layer (RDL). The metal segment 131 and metal segment 132 are partially overlapped but are not conducted. The two ends of the metal segment 131 respectively connect the metal segments 122 and 111 through a via 135, a through silicon via (TSV), or their arrays, and the two ends of the metal segment 132 respectively connect the metal segments 112 and 121 that are located in the same layer as the metal segment 132. In this embodiment, the metal segment 132 and the metal segment 112 and/or 121 can be regarded as individual metal segments. In another embodiment, the metal segment 132 can be regarded as an extension of the metal segment 112 and/or 121. In other words, the metal segment 131 is a part of the first sensing unit, and the metal segment 132 is a part of the second sensing unit. Because in the semiconductor structure the resistance values of different metal layers are usually different, the bridging structure 130 causes the mismatch in resistance values of the first sensing unit and the second sensing unit.

Figure 1C:
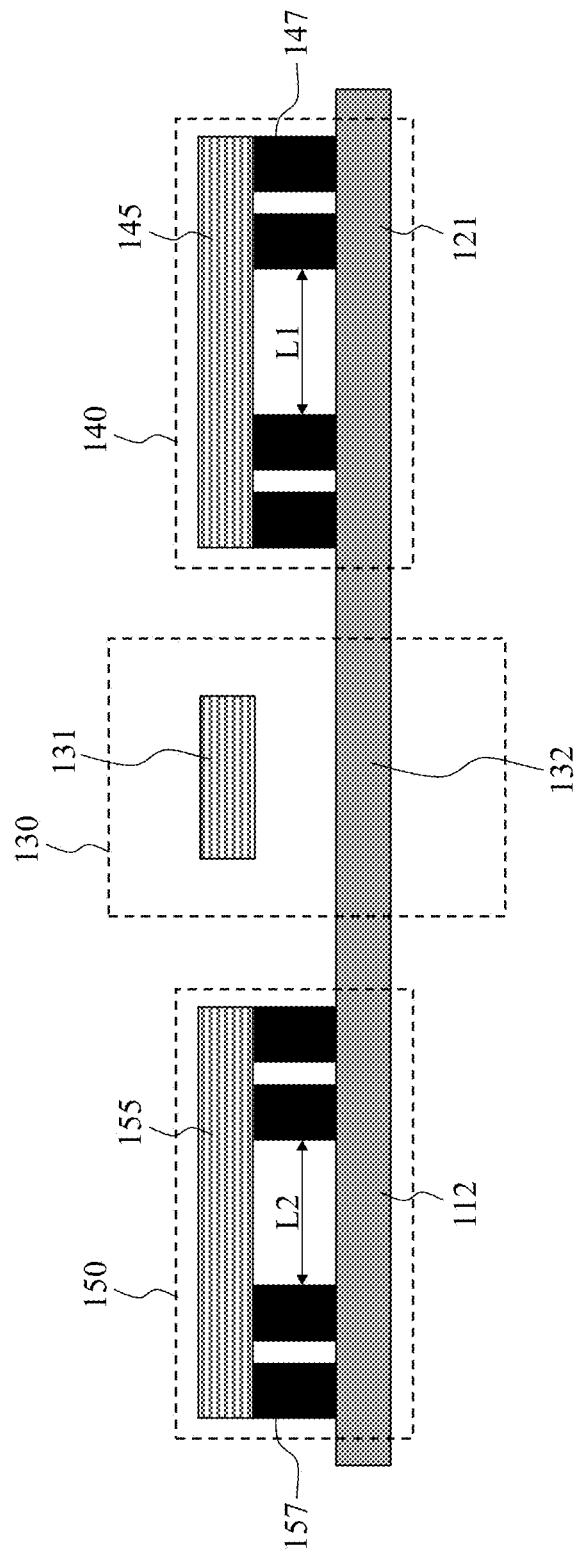
FIG. 1C shows a lateral view of the bridging structure 130 as well as the areas 140 and 150 in FIG. 1A.

To have the resistance values and the inductance values of the two sensing units of the 8-shaped integrated inductor 100 match each other, one of the sensing units is provided with a metal segment that can be used to adjust the resistance value. As shown in FIG. 1A, the metal segments 145 and 155 are respectively implemented in the areas 140 and 150 of the second sensing unit. FIG. 1C shows a lateral view of the bridging structure 130 as well as the areas 140 and 150 in FIG. 1A. For reasons of clarity and simplicity, a part of the metal segments and the via structures are omitted in FIG. 1C. As shown in FIG. 1C, the metal segment 145 and the metal segment 131 are located in the same layer of the semiconductor structure. The metal segment 145 and the metal segment 121 are connected through the vias/TSVs 147 or their arrays substantially perpendicular to the metal segment 145. Similarly, the metal segment 155 and the metal segment 131 are located in the same layer of the semiconductor structure. The metal segment 155 and the metal segment 112 are connected through the vias/TSVs 157 or their arrays substantially perpendicular to the metal segment 155. As such, the metal segments 145 and 155 are parts of the second sensing unit of the 8-shaped integrated inductor 100, in both structural and electrical aspects. In another embodiment, the metal segment 145 and/or the metal segment 155 can be fabricated in a different metal layer from the metal layer where the metal segment 131 exists.

In one embodiment of this invention, the metal segments 121, 132 and 112 are fabricated in the UTM layer, and the metal segments 131, 145 and 155 are fabricated in the RDL. Because the RDL has a higher resistance value than the UTM layer, the overall resistance value of the first sensing unit is higher than the second sensing unit before the metal segments 145 and 155 are fabricated in the 8-shaped integrated inductor 100. The resistance value of the second sensing unit, after a part of the metal segments of the second sensing unit is connected with the metal segments 145 and 155 in other layers, can be adjusted by adjusting the lengths of the metal segments 145 and 155 and/or the number of the vias 147 and 157. The longer the metal segment 145 and/or the metal segment 155 is, the greater the overall resistance value of the second sensing unit becomes. Further, as the number of the vias/TSVs 147 and/or 157 becomes greater, the overall resistance value of the second sensing unit becomes greater as well. In this embodiment the metal segments 145 and 155 are located above the metal segments 121 and 112, and therefore the metal segments 145 and 155 are referred to as overpass metal segments. Alternatively, the metal segments 145 and 155 can also be fabricated in a metal layer under the metal segments 121 and 112, and in this case the metal segments 145 and 155 are referred to as underpass metal segments.

The metal segment 131 is a part of the first sensing unit of the 8-shaped integrated inductor 100 while the metal segment 132 is a part of the second sensing unit of the 8-shaped integrated inductor 100. In other words, the metal segment 131 in fact crosses the second sensing unit. However, although being located in a different layer from most metal segments of the first sensing unit, the metal segment 145 and the metal segment 155 do not cross the first sensing unit. To be specific, the metal segment 145 (155) is fabricated in a projection region of the metal segment 121 (112) on a metal layer where the metal segment 145 (155) exists, and the metal segments of the first sensing unit are not included in the projection region of the metal segment 145 (155) on other metal layers.

The lengths of the metal segment 145 and the metal segment 155 can be identical or different. In one embodiment, when the width of the metal segment of the 8-shaped integrated inductor 100 is 20 μm and the metal segment 145 and the metal segment 155 have the same number of vias and identical length (L1=L2=3 μm), the S parameters of the two sensing units are 0.59609 and 0.5958 (operated at 6.4 GHz), with the difference between the two being 0.0003. As a comparison, when the 8-shaped integrated inductor 100 does not include the metal segment 145 and the metal segment 155, the S parameters of the two sensing unit are respectively 0.59405 and 0.59323, with the difference between the two being 0.0008. In other words, by adding the metal segment to adjust the difference between the resistance values of the two sensing units, the S parameter difference is reduced from 0.0008 to 0.0003. When the 8-shaped integrated inductor 100 is applied to a voltage controlled oscillator (VCO), the decrease in the inductance value difference causes the variance of the peak-to-peak value of the VCO, which is originally 50 mV, to be lowered to as low as 5 mV to 10 mV. The inductance value and the resistance value are both equivalent values derived from the S parameter. In other words, if the S parameters are symmetric in both magnitude and phase, the VCO that employs the 8-shaped integrated inductor 100 has better circuit performance.

Adding the metal segment on the 8-shaped integrated inductor is also beneficial to improving the symmetry of the bridging structure. The closer the metal segment 145 and the metal segment 155 are to the bridging structure 130, the higher the symmetry of the 8-shaped integrated inductor 100 near the bridging structure 130 is, which in turn causes the direction of the magnetic field generated by the 8-shaped integrated inductor 100 to be more inclined to be perpendicular to the plane where the 8-shaped integrated inductor 100 exists, and therefore suppresses magnetic field radiations.

Figure 1D:
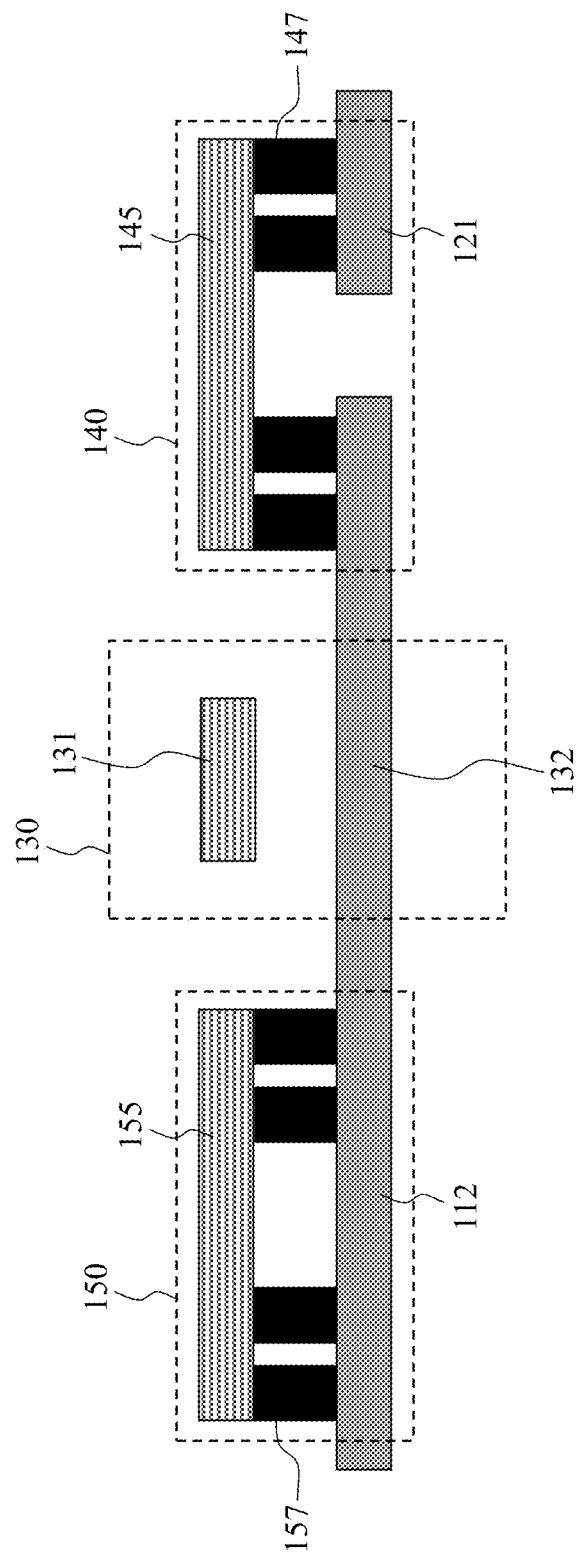
FIG. 1D shows a lateral view of the bridging structure 130 as well as the areas 140 and 150 in FIG. 1A.

FIG. 1D shows a lateral view of the bridging structure 130 as well as the areas 140 and 150 in FIG. 1A according to another embodiment. This embodiment is similar to that of FIG. 1C, except that in FIG. 1C the second sensing unit includes the metal segment in a projection region of the metal segment 145 on the metal layer where the metal segment 121 exists. In other words, between the two adjacent vias of the metal segment 145, the second sensing unit includes the metal segment. In FIG. 1D, on the contrary, the second sensing unit does not include a metal segment in a projection region of the metal segment 145 on the metal layer where the metal segment 121 exists. In other words, between the two adjacent vias of the metal segment 145, the second sensing unit does not include a metal segment.

In the above embodiments, the two metal segments 145 and 155 included in the second sensing unit are not limited to being fabricated near the bridging structure 130. As shown in FIG. 2, the overpass/underpass metal segments of the 8-shaped integrated inductor 200 can be respectively fabricated in areas that are symmetric with respect to the bridging structure 230. For example, one of a pair of overpass/underpass metal segments is fabricated in the area 210*a* and the other in area 210*b*. Alternatively, one of them is fabricated in the area 220*a* and the other in the area 220*b*. In the structures of the 8-shaped integrated inductor 200 or the second sensing unit, the area 210*a* (220*a*) and the area 210*b* (220*b*) are symmetric with respect to the bridging structure 230. However, in another embodiment, the 8-shaped integrated inductor may contain only one overpass/underpass metal segment to implement the function of adjusting the resistance value.

The present invention shows even better performance when applied to an integrated inductor that includes an odd number of bridging structures. As shown in the above embodiments, the two coils of the 8-shaped integrated inductors 100 and 200 are both one-turn structures, so the 8-shaped integrated inductor made up of two one-turn coils includes only one bridging structure.

Figure 3A:
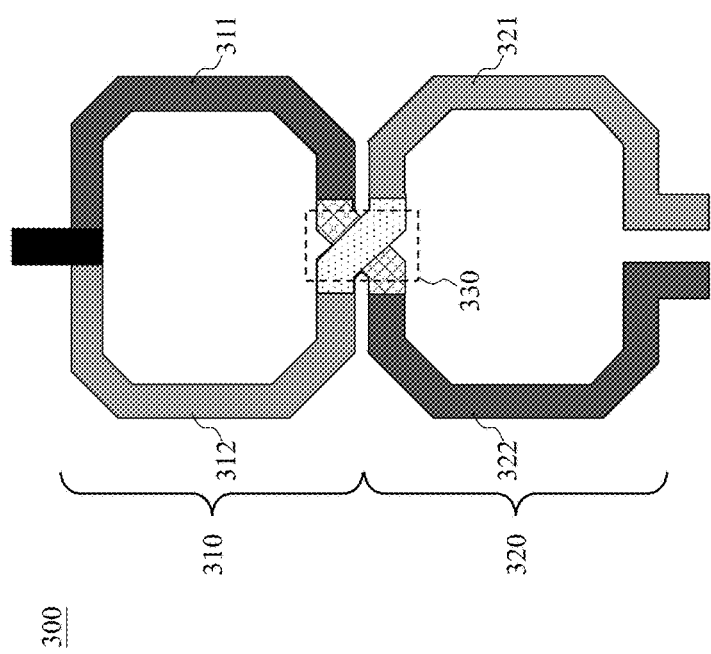
FIG. 3A illustrates a structure of an 8-shaped integrated inductor according to another embodiment of this invention.
Figure 3B:
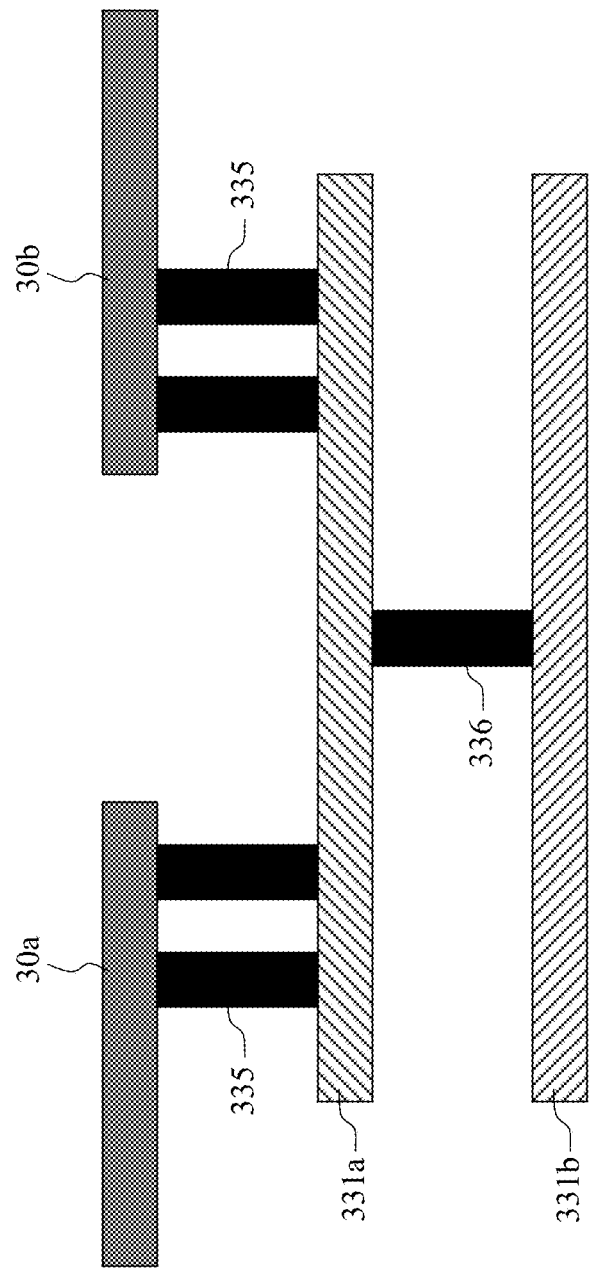
FIG. 3B shows a lateral view of the bridging structure of FIG. 3A.

To make the resistance values of the sensing units of the integrated inductor match, the two metal segments of the bridging structure can be respectively fabricated in two different metal layers of the same or similar resistance values. FIG. 3A illustrates another structure of the 8-shaped integrated inductor according to another embodiment of the present invention. FIG. 3B shows a lateral view of the bridging structure of FIG. 3A. The coils 310 and 320 of the 8-shaped integrated inductor 300 are connected by a bridging structure 330. In FIG. 3B, the metal segments 30*a* and 30*b* are located in the metal layer where the coils 310 and 320 exist, and are connected with the metal segment 331*a* in the lower metal layer through the vias/TSVs 335 or their arrays. The metal segment 331*a* can optionally be further connected with the metal segment 331*b* in the lower metal layer through the vias/TSVs 336 or their arrays. In other words, the metal segments 30*a* and 30*b* can be connected through the metal segment 331*a* (and optionally 331*b*).

In one embodiment, the coil 310 and the coil 320 can both be fabricated in the UTM layer of the semiconductor structure, where the metal segments 312 and 321 are connected through the sixth metal layer and/or the fourth metal layer of the semiconductor structure, and the metal segments 322 and 311 are connected through the fifth metal layer and/or the third metal layer of the semiconductor structure. Referring to the lateral view of FIG. 3B for further explanation, when the metal segments 30*a* and 30*b* correspond respectively to the metal segments 312 and 321, the metal segments 331*a* and 331*b* are respectively located in the sixth and fourth metal layers of the semiconductor structure; when the metal segments 30*a* and 30*b* correspond respectively to the metal segments 322 and 311, the metal segments 331*a* and 331*b* are respectively located in the fifth and third metal layers of the semiconductor structure. The abovementioned third, fourth, fifth and sixth metal layers, stacked in order from bottom to top, are located between a substrate and the UTM layer of the semiconductor structure. The UTM layer can also be referred to as a seventh metal layer. Typically, the third and fourth metal layers have similar resistance values, and the fifth and sixth metal layers have similar resistance values; thus, the bridging structure shown in FIG. 3B is of great help in making the resistance values of the two sensing units of the 8-shaped integrated inductor 300 match.

Figure 4:
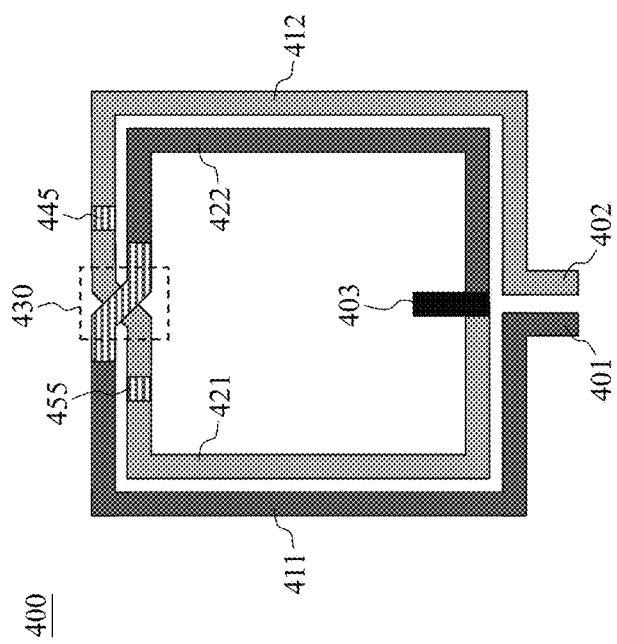
FIG. 4 illustrates a structure of a spiral integrated inductor according to an embodiment of this invention.

In addition to the 8-shaped integrated inductor, this invention can also be applied to a spiral integrated inductor. FIG. 4 illustrates a structure of a spiral integrated inductor according to an embodiment of this invention. The spiral integrated inductor 400 is formed by an inner coil and an outer coil. The outer coil includes the metal segments 411 and 412, and the inner coil includes the metal segments 421 and 422. The outer coil and the inner coil are connected by the bridging structure 430. The first sensing unit of the spiral integrated inductor 400 (in dark grey) uses the terminals 401 and 403 (i.e., the center tap of the spiral integrated inductor 400) as its two terminals, and the second sensing unit of the spiral integrated inductor 400 (in light grey) uses the terminals 402 and 403 as its two terminals. The spiral integrated inductor 400 can implement both the metal segment 445 and the metal segment 455, or alternatively, only one of them. The metal segment 445 and the metal segment 455 are connected with the metal segment(s) of the second sensing unit without crossing the metal segment(s) of the first sensing unit. The first and second sensing units are better matched in resistance values by adjusting the length(s) of the metal segments 445 and/or 455, so the inductance values of two sensing units become even closer. Similar to the 8-shaped integrated inductor, the present invention demonstrates even better performance when applied to a spiral integrated inductor that includes an odd number of bridging structures.

Note that the shape, size, and ratio of any element in the disclosed figures are exemplary for understanding, not for limiting the scope of this invention. Further, although the above embodiments use 8-shaped integrated inductors and spiral integrated inductors as examples, people having ordinary skill in the arts can apply this invention to other types of integrated inductors according to the disclosure of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An integrated inductor, formed by a first sensing unit and a second sensing unit, comprising:
   a first terminal, employed as a terminal of said first sensing unit;
   a second terminal, employed as a terminal of said second sensing unit;
   a first coil, wherein a part of metal segments of said first coil is a part of said first sensing unit, and another part of metal segments of said first coil is a part of said second sensing unit;
   a second coil, wherein a part of metal segments of said second coil is a part of said first sensing unit, and another part of metal segments of said second coil is a part of said second sensing unit; and
   a bridging structure, for connecting said first coil and said second coil, comprising a first metal segment and a second metal segment, said first metal segment and said second metal segment being located in different metal layers and partially overlapping;
   wherein, said first sensing unit comprises said first metal segment, said second sensing unit comprises said second metal segment and a third metal segment, said third metal segment is located in a different metal layer from said second metal segment, and said third metal segment is conductively connected with other metal segments of said second sensing unit without crossing metal segments of said first sensing unit.

2. The integrated inductor of claim 1, further comprising:
   a first connecting structure, substantially perpendicular to said third metal segment, for connecting said third metal segment and other metal segments of said second sensing unit; and
   a second connecting structure, substantially perpendicular to said third metal segment, for connecting said third metal segment and other metal segments of said second sensing unit;
   wherein, between said first connecting structure and said second connecting structure, said second sensing unit does not comprise metal segments in a metal layer where said second metal segment exists.

3. The integrated inductor of claim 1, wherein, in a projection region of said third metal segment on a metal layer where said second metal segment exists, said second sensing unit does not comprise metal segments.

4. The integrated inductor of claim 1, wherein, in a projection region of said third metal segment on a metal layer where said second metal segment exists, said second sensing unit comprises metal segments.

5. The integrated inductor of claim 1 comprising an odd number of bridging structures.

6. The integrated inductor of claim 1, further comprising:
   a third terminal, employed as a common terminal of said first sensing unit and said second sensing unit.

7. The integrated inductor of claim 1, wherein said first coil is an outer coil and said second coil is an inner coil located in a region enclosed by said outer coil.

8. The integrated inductor of claim 1, wherein the metal layers of said first metal segment and said second metal segment are different from the metal layers where said first coil and said second coil exist.

9. The integrated inductor of claim 1, wherein said first coil and said second coil are both one-turn structures.

* * * * *